(12) United States Patent
Tsai et al.

(10) Patent No.: US 8,877,623 B2
(45) Date of Patent: Nov. 4, 2014

(54) METHOD OF FORMING SEMICONDUCTOR DEVICE

(75) Inventors: Shih-Hung Tsai, Tainan (TW); Ssu-I Fu, Kaohsiung (TW); Ying-Tsung Chen, Kaohsiung (TW); Chih-Wei Chen, Taichung (TW); Chien-Ting Lin, Hsinchu (TW); Wen-Tai Chiang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 11 days.

(21) Appl. No.: 13/471,128

(22) Filed: May 14, 2012

(65) Prior Publication Data
US 2013/0302976 A1 Nov. 14, 2013

(51) Int. Cl.
*H01L 21/3205* (2006.01)

(52) U.S. Cl.
USPC .............................. 438/589; 438/183; 438/184

(58) Field of Classification Search
USPC ......................................... 438/183, 184, 589
See application file for complete search history.

(56) References Cited

U.S. PATENT DOCUMENTS

| | | | |
|---|---|---|---|
| 6,033,963 A * | 3/2000 | Huang et al. .................. | 438/303 |
| 6,043,138 A | 3/2000 | Ibok | |
| 6,200,865 B1 * | 3/2001 | Gardner et al. .............. | 438/291 |
| 6,465,290 B1 * | 10/2002 | Suguro et al. ................ | 438/183 |
| 6,492,216 B1 | 12/2002 | Yeo et al. | |
| 6,563,178 B2 * | 5/2003 | Moriwaki et al. ............. | 257/369 |
| 6,921,711 B2 * | 7/2005 | Cabral et al. .................. | 438/589 |
| 6,921,963 B2 | 7/2005 | Krivokapic et al. | |
| 7,064,024 B2 * | 6/2006 | Yagishita ....................... | 438/183 |
| 7,087,477 B2 | 8/2006 | Fried et al. | |
| 7,091,551 B1 | 8/2006 | Anderson et al. | |
| 7,126,199 B2 * | 10/2006 | Doczy et al. .................. | 257/412 |
| 7,247,887 B2 | 7/2007 | King et al. | |
| 7,250,658 B2 | 7/2007 | Doris et al. | |
| 7,309,626 B2 | 12/2007 | Ieong et al. | |
| 7,352,034 B2 | 4/2008 | Booth, Jr. et al. | |
| 7,390,709 B2 * | 6/2008 | Doczy et al. .................. | 438/199 |
| 7,470,570 B2 | 12/2008 | Beintner et al. | |
| 7,528,025 B2 * | 5/2009 | Brask et al. ................... | 438/183 |
| 7,531,437 B2 * | 5/2009 | Brask et al. ................... | 438/585 |
| 7,569,857 B2 | 8/2009 | Simon et al. | |
| 7,645,653 B2 * | 1/2010 | Takaishi ........................ | 438/183 |
| 7,655,989 B2 | 2/2010 | Zhu et al. | |
| 7,859,053 B2 | 12/2010 | Chang et al. | |
| 8,008,143 B2 * | 8/2011 | Hsu et al. ...................... | 438/183 |
| 8,058,119 B2 * | 11/2011 | Chung et al. .................. | 438/199 |
| 8,283,222 B2 * | 10/2012 | Hsu et al. ...................... | 438/183 |
| 2004/0094807 A1 * | 5/2004 | Chau et al. .................... | 257/401 |
| 2004/0195624 A1 | 10/2004 | Liu et al. | |
| 2005/0051825 A1 | 3/2005 | Fujiwara et al. | |

(Continued)

Primary Examiner — Caleb Henry
(74) Attorney, Agent, or Firm — J.C. Patents

(57) ABSTRACT

A method of forming a semiconductor device is provided. A first interfacial material layer is formed by a deposition process on a substrate. A dummy gate material layer is formed on the first interfacial material layer. The dummy gate material layer and the first interfacial material layer are patterned to form a stacked structure. An interlayer dielectric (ILD) layer is formed to cover the stacked structure. A portion of the ILD layer is removed to expose a top of the stacked structure. The stacked structure is removed to form a trench in the ILD layer. A second interfacial layer and a first high-k layer are conformally formed at least on a surface of the trench. A composite metal layer is formed to at least fill up the trench.

17 Claims, 16 Drawing Sheets

(56) References Cited

U.S. PATENT DOCUMENTS

| | | | |
|---|---|---|---|
| 2005/0148137 A1* | 7/2005 | Brask et al. | 438/216 |
| 2006/0099749 A1* | 5/2006 | Yagishita | 438/183 |
| 2006/0099830 A1 | 5/2006 | Walther et al. | |
| 2006/0194378 A1* | 8/2006 | Yagishita | 438/183 |
| 2006/0286729 A1* | 12/2006 | Kavalieros et al. | 438/183 |
| 2007/0108528 A1 | 5/2007 | Anderson et al. | |
| 2007/0158756 A1 | 7/2007 | Dreeskornfeld et al. | |
| 2007/0158764 A1 | 7/2007 | Orlowski et al. | |
| 2008/0157208 A1 | 7/2008 | Fischer et al. | |
| 2009/0057769 A1* | 3/2009 | Wei et al. | 257/369 |
| 2009/0087974 A1* | 4/2009 | Waite et al. | 438/592 |
| 2009/0124097 A1 | 5/2009 | Cheng | |
| 2009/0236669 A1* | 9/2009 | Chen et al. | 257/380 |
| 2009/0242964 A1 | 10/2009 | Akil et al. | |
| 2009/0242997 A1* | 10/2009 | Yu et al. | 257/379 |
| 2009/0269916 A1 | 10/2009 | Kang et al. | |
| 2010/0048027 A1 | 2/2010 | Cheng et al. | |
| 2010/0052059 A1 | 3/2010 | Lee | |
| 2010/0052074 A1* | 3/2010 | Lin et al. | 257/407 |
| 2010/0072553 A1 | 3/2010 | Xu et al. | |
| 2010/0144121 A1 | 6/2010 | Chang et al. | |
| 2010/0167506 A1 | 7/2010 | Lin et al. | |
| 2011/0018072 A1* | 1/2011 | Lin et al. | 257/410 |
| 2011/0306196 A1* | 12/2011 | Hsu et al. | 438/591 |

* cited by examiner

METHOD OF FORMING SEMICONDUCTOR DEVICE

BACKGROUND OF THE INVENTION

1. Field of Invention

The present invention relates to a method of forming an integrated circuit, and more generally to a method of forming a semiconductor device.

2. Description of Related Art

MOS is a basic structure widely applied to various semiconductor devices, such as memory devices, image sensors and display devices. The traditional MOS transistor is difficult to scale down due to the limitation of the fabricating process, and a multi-gate transistor with better properties is therefore developed. One example is the fin-type field effect transistor (FinFET) with multiple three-dimensional (3D) fins. The effective channel of the FinFET is disposed not only on the top surface portion but also on the sidewall portion of each fin, so as to greatly increase the channel width.

However, the fins of the FinFET are easy to be deformed by the subsequent processes, thereby reducing the device performance. Therefore, how to prevent the shape of the fins from being deformed by the subsequent processes has drawn great attention in the industry.

SUMMARY OF THE INVENTION

The present invention provides a method of forming a semiconductor structure, in which the shape of the fins of the FinFET is maintained as original, and device degradation caused by the fin deformation is thus avoided.

The present invention provides a method of forming a semiconductor device. A first interfacial material layer is formed by a deposition process on a substrate. A dummy gate material layer is formed on the first interfacial material layer. The dummy gate material layer and the first interfacial material layer are patterned to form a stacked structure. An interlayer dielectric (ILD) layer is formed to cover the stacked structure. A portion of the ILD layer is removed to expose a top of the stacked structure. The stacked structure is removed to form a trench in the ILD layer. A second interfacial layer and a first high-k layer are conformally formed at least on a surface of the trench. A composite metal layer is formed to at least fill up the trench.

According to an embodiment of the present invention, the deposition process includes an atomic layer deposition (ALD) process, a chemical vapor deposition (CVD) process, a physical vapor deposition (PVD) process or a sputter deposition process.

According to an embodiment of the present invention, the first interfacial material layer includes silicon oxide, silicon nitride or silicon oxynitride.

According to an embodiment of the present invention, the second interfacial layer is formed by a deposition process, such as an ALD process, a CVD process, a PVD process or a sputter deposition process.

According to an embodiment of the present invention, the second interfacial layer includes silicon oxide, silicon nitride or silicon oxynitride.

According to an embodiment of the present invention, the first high-k layer is formed by a deposition process.

According to an embodiment of the present invention, the first high-k layer includes a high-k material with a dielectric constant greater than 4.

According to an embodiment of the present invention, the method further includes forming at least one second high-k layer after forming the second interfacial layer and before forming the first high-k layer.

According to an embodiment of the present invention, the second high-k layer is formed by a deposition process.

According to an embodiment of the present invention, the second high-k layer includes a high-k material with a dielectric constant greater than 4.

According to an embodiment of the present invention, the substrate is a bulk substrate.

According to an embodiment of the present invention, the substrate is a substrate with fins extending in a first direction, and the stacked structure crosses the fins and extends in a second direction different from the first direction.

According to an embodiment of the present invention, the second direction is perpendicular to the first direction.

According to an embodiment of the present invention, the method further includes forming an insulating layer to fill lower portions of gaps between the fins before forming the first interfacial material layer.

According to an embodiment of the present invention, after forming the stacked structure and before forming the ILD layer, the method further includes forming a spacer beside the stacked structure, and forming a contact etch stop layer to cover the stacked structure.

According to an embodiment of the present invention, the method further includes removing the second interfacial layer, the first high-k layer and the composite metal layer outside the trench.

According to an embodiment of the present invention, the composite metal layer includes a work function metal layer and a low resistivity metal layer.

According to an embodiment of the present invention, the work function metal layer includes TiAl or TiN, and the low resistivity metal layer includes Al or Cu.

According to an embodiment of the present invention, the composite metal layer further includes a bottom barrier layer disposed between the first high-k layer and the work function metal layer, a top barrier layer disposed between the work function metal layer and the low resistivity metal layer, and an etch stop metal layer disposed between the bottom barrier layer and the work function metal layer.

According to an embodiment of the present invention, the bottom barrier layer includes TiN, the top barrier layer includes TiN, and the etch stop metal layer includes TaN.

In view of the above, in the present invention, a deposition process is used to replace the conventional thermal oxidation treatment for forming an interfacial layer. In other words, the interfacial layer of the present invention can be formed without consuming any silicon from the fins (or substrate). Therefore, device degradation caused by the fin deformation is not observed as the fins (or substrate) are not subjected to any silicon loss during the formation of the interfacial layer.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
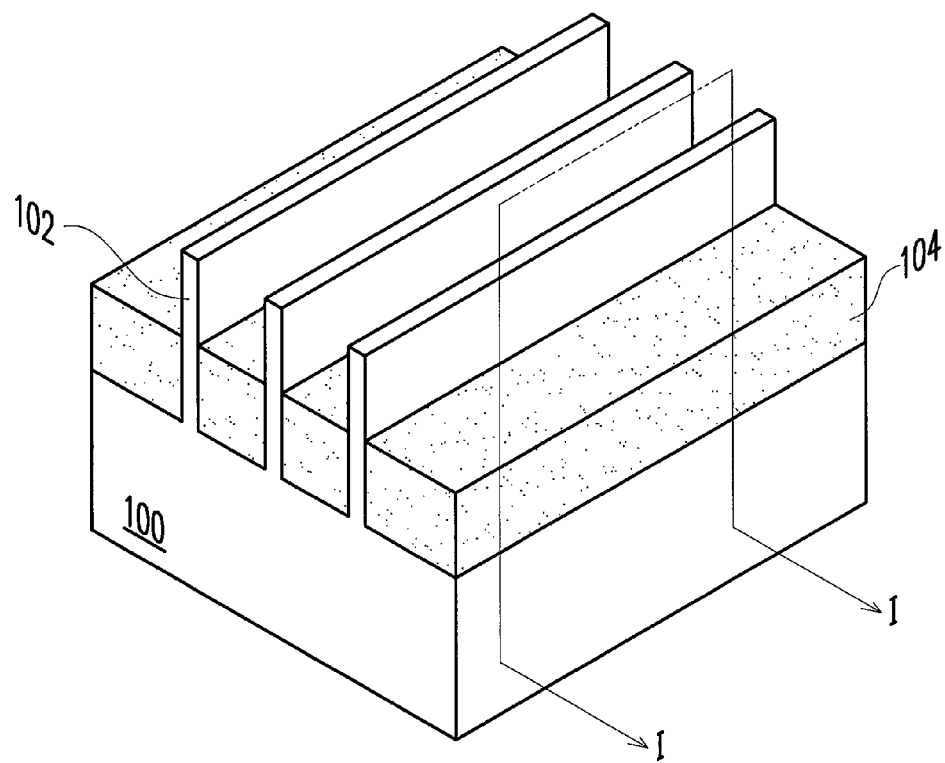
FIGS. 1A to 1F are three-dimensional schematic views illustrating a method of forming a semiconductor structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are three-dimensional schematic views illustrating a method of forming a semiconductor structure according to an embodiment of the present invention. FIGS. 2A to 2F are schematic cross-sectional views taken along the lines I-I of FIGS. 1A to 1F.

Figure 2A:
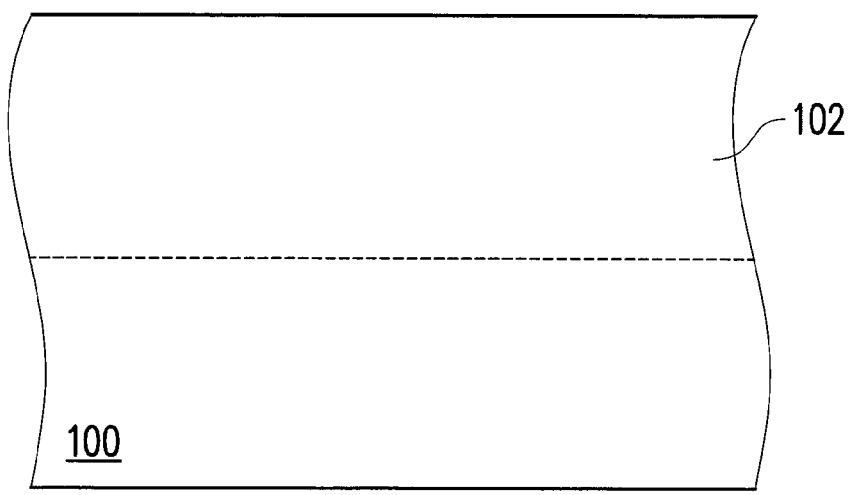
FIGS. 2A to 2F are schematic cross-sectional views taken along the lines I-I of FIGS. 1A to 1F.

Referring to FIGS. 1A and 2A, a semiconductor substrate is provided. The semiconductor substrate can be a silicon-containing substrate 100 with multiple fins 102 extending in a first direction. Thereafter, an insulating layer 104 is formed to fill the lower portions of gaps between the fins 102. The material of the insulating layer 104 can be, but is not limited to, silicon oxide. The method of forming the insulating layer 104 includes depositing an insulating material layer (not shown) on the substrate 100 covering the fins 102, optionally performing a planarization process to make insulating layer 104 flat, and then performing an etching back process until the upper portions of the fins 102 are exposed.

Figure 1B:
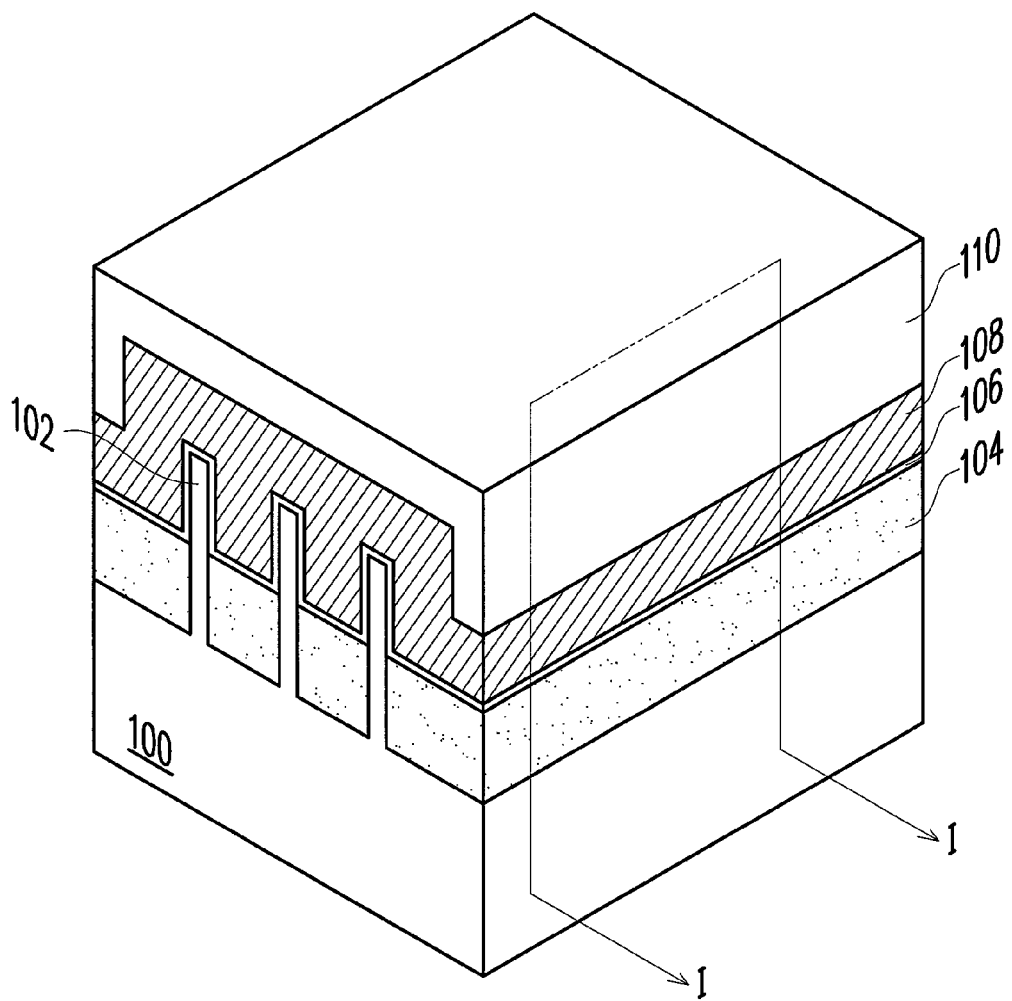
Figure 2B:
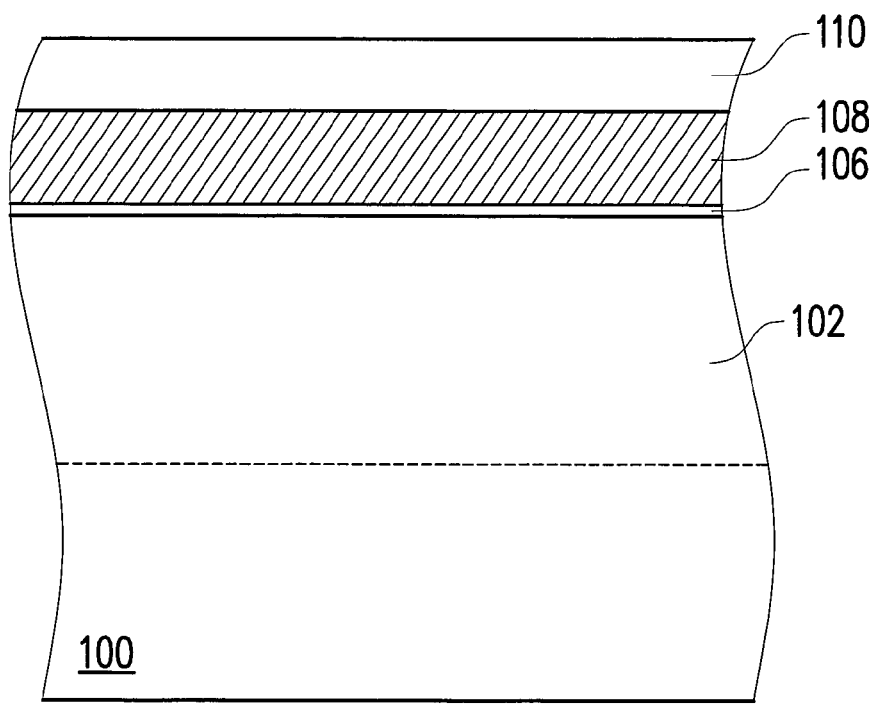

Referring to FIGS. 1B and 2B, a first interfacial material layer 106 is conformally formed on the substrate 100 covering the fins 102. The first interfacial material layer 106 includes silicon oxide, silicon nitride or silicon oxynitride. The first interfacial material layer 106 is formed by a deposition process, such as an atomic layer deposition (ALD) process, a chemical vapor deposition (CVD) process, a physical vapor deposition (PVD) process or a sputter deposition process. It is noted that the first interfacial material layer 106 is formed by a deposition process rather than a thermal oxidation treatment. Silicon consumption due to the thermal oxidation treatment does not occur, so that the shape of the fins 102 is not deformed during the step of forming the first interfacial material layer 106. As shown in FIG. 1B, the first interfacial material layer 106 is conformally formed along the surface of each fin 102. In the present embodiment, since the first interfacial material layer 106 is formed by a deposition process without consuming any silicon, the shape of the fins 102 keeps well-defined after the formation of the first interfacial material layer 106.

Thereafter, a dummy gate material layer 108 and a mask material layer 110 are sequentially formed on the first interfacial material layer 106. The dummy gate material layer 108 includes polysilicon. The mask material layer 110 includes silicon oxide, silicon nitride, silicon oxynitride or a combination thereof. Each of the dummy gate material layer 108 and the mask material layer 110 can be formed by a deposition process, such as an ALD process, a CVD process, a PVD process or a sputter deposition process. In FIGS. 1B and 2B, a single mask material layer 110 is provided for illustration purposes, but the present invention is not limited thereto. In another embodiment, the mask material layer 110 can be a multi-layer structure including, for example, a lower silicon nitride layer and an upper silicon oxide layer.

Figure 1C:
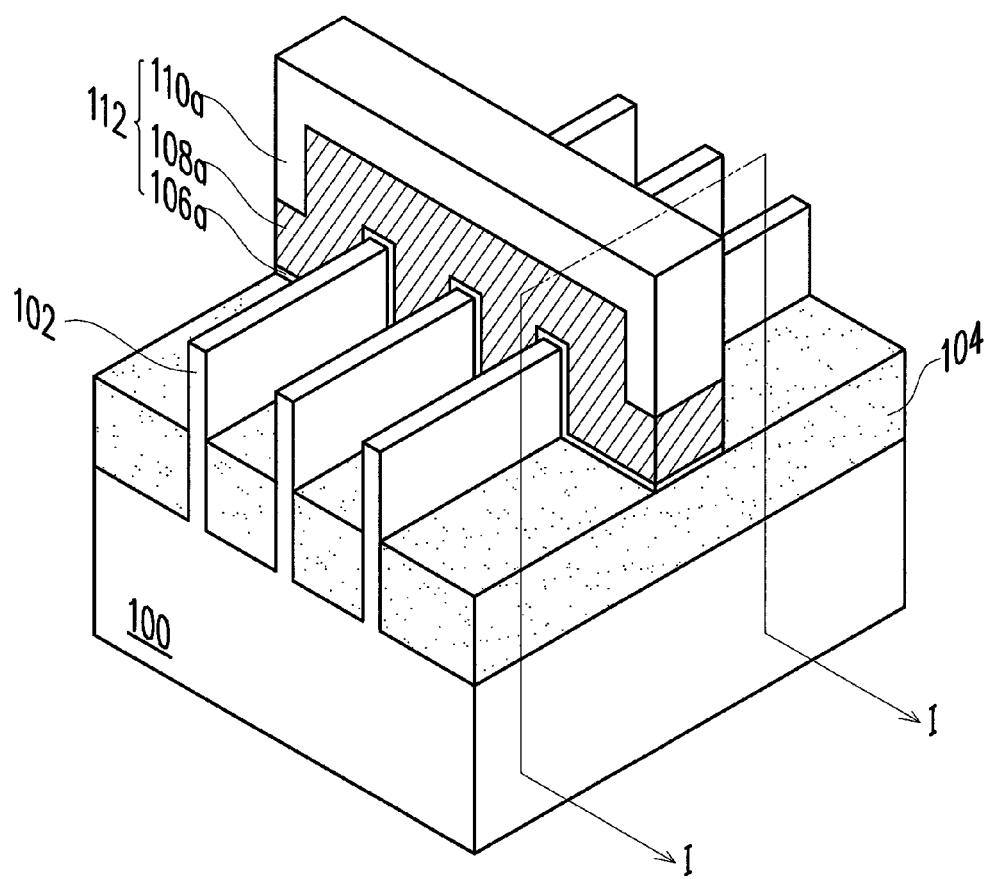
Figure 2C:
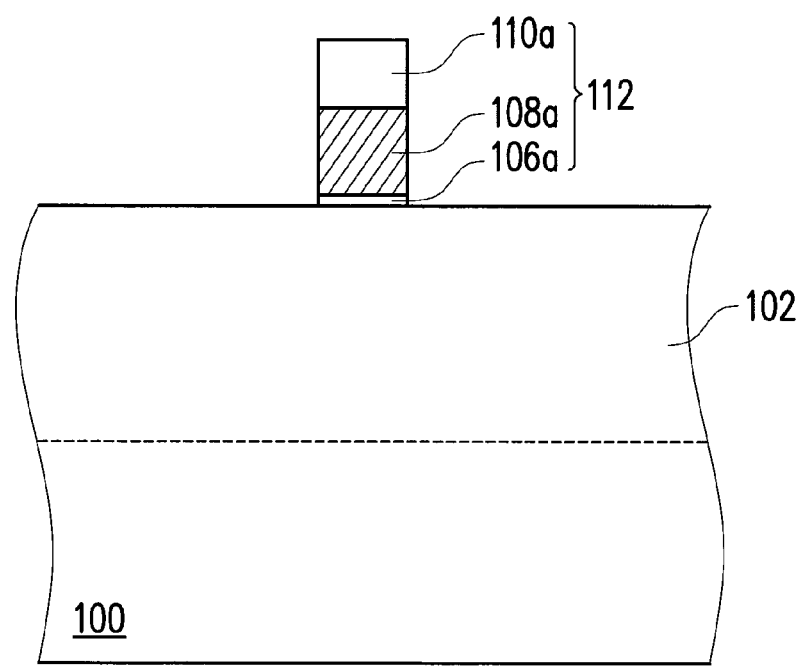

Referring to FIGS. 1C and 2C, the mask material layer 110, the dummy gate material layer 108 and the first interfacial material layer 106 are patterned to form a stacked structure 112 including a first interfacial layer 106a, a dummy gate 108a and a mask layer 110a sequentially formed on the substrate 100. The stacked structure 112 crosses the fins 102 and extends in a second direction different from the first direction. In an embodiment, the second direction is perpendicular to the first direction. The patterning step includes performing photolithography and etching processes.

Figure 1D:
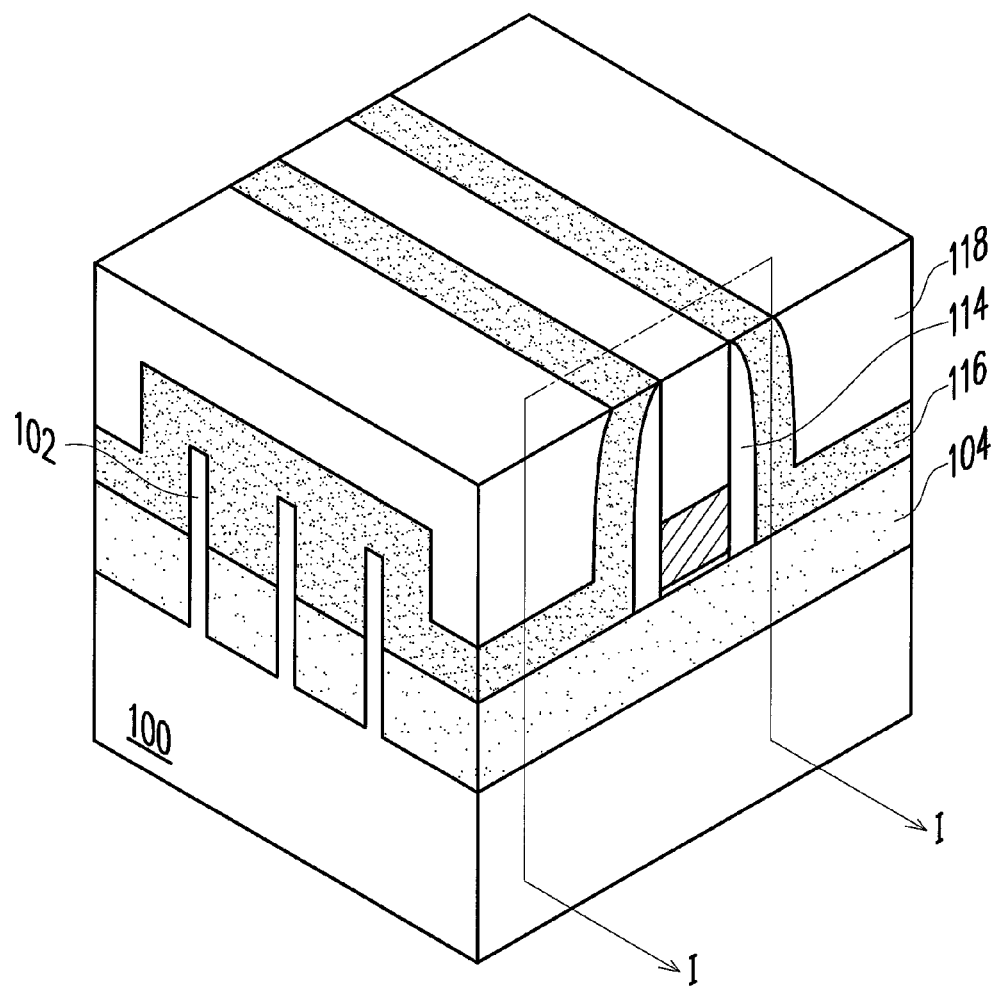
Figure 2D:
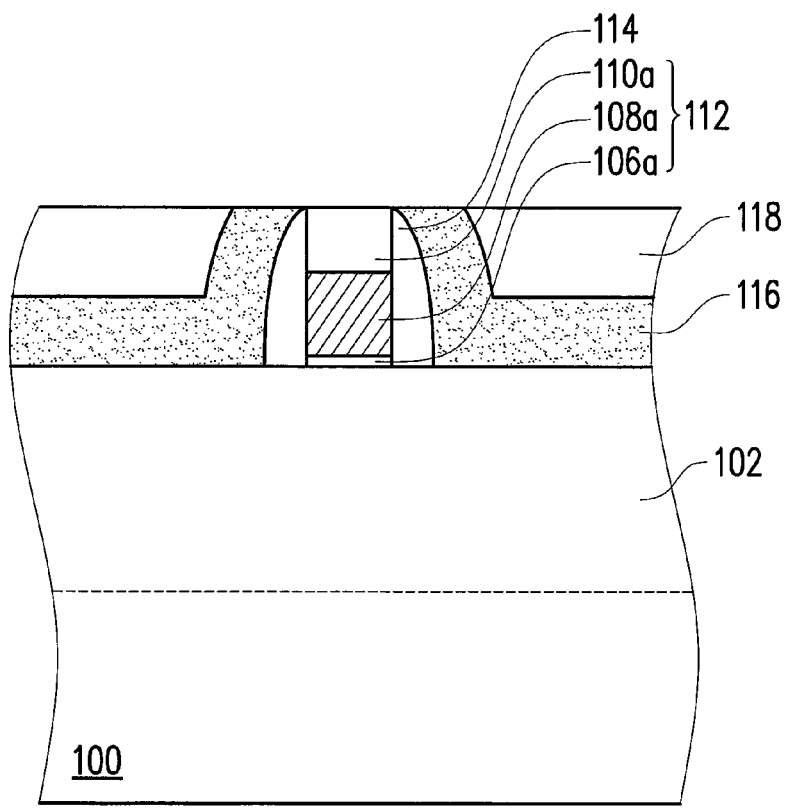

Referring to FIGS. 1D and 2D, a spacer 114 is formed beside the stacked structure 112. The method of forming the spacer 114 includes forming a silicon oxide layer on the substrate 100 and then performing an anisotropic etching process to remove a portion of the silicon oxide layer. Source and drain regions (not shown) are then formed in the substrate 100 beside the spacer 114. Thereafter, a contact etch stop layer (CESL) 116 and an interlayer dielectric (ILD) layer 118 are sequentially formed on the substrate 100 to cover the stacked structure 112. The CESL 116 includes silicon nitride. The ILD layer 118 includes silicon oxide, silicon nitride, silicon oxynitride, silicon carbide, low-dielectric constant dielectric material or a combination thereof. Each of the CESL 116 and the ILD layer 118 can be formed by a deposition process, such as an ALD process, a CVD process, a PVD process or a sputter deposition process. Afterwards, a portion of the ILD layer 118 and a portion of the CESL 116 are removed to expose the top of the stacked structure 112.

Figure 1E:
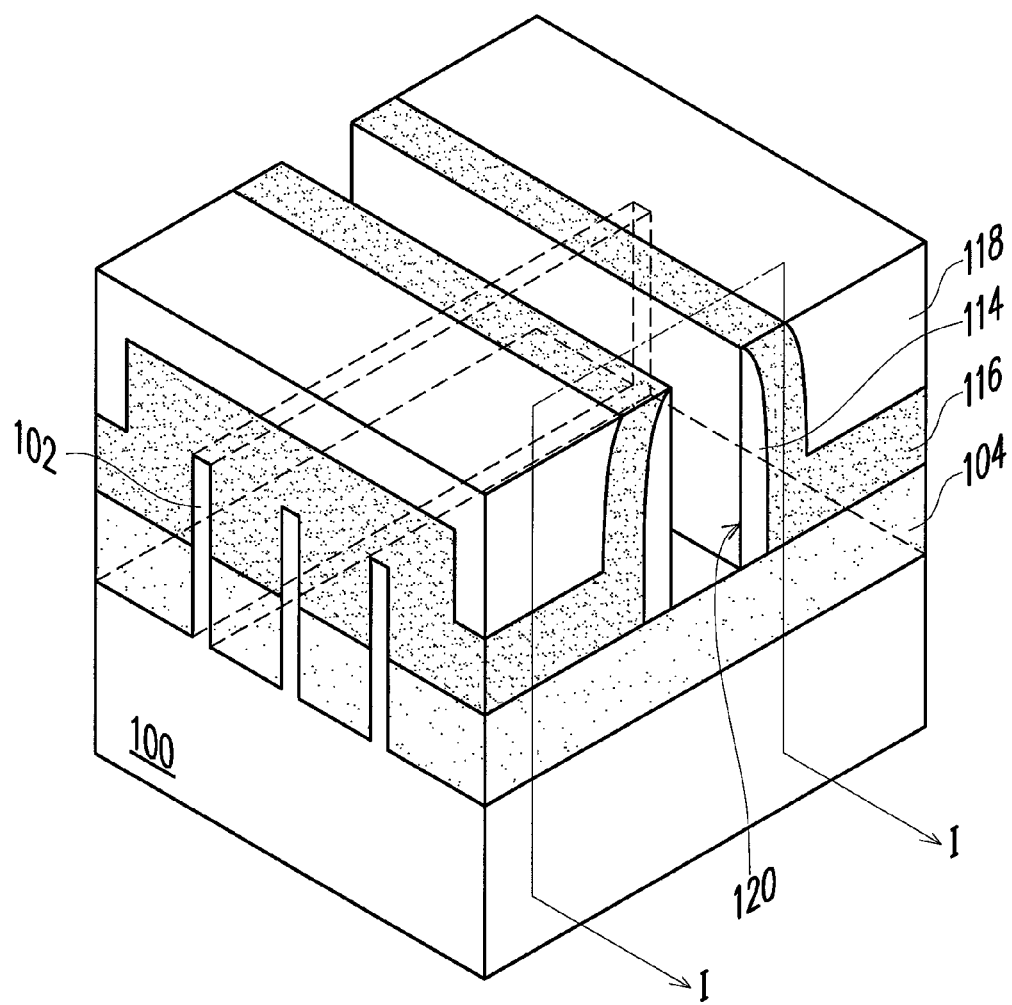
Figure 2E:
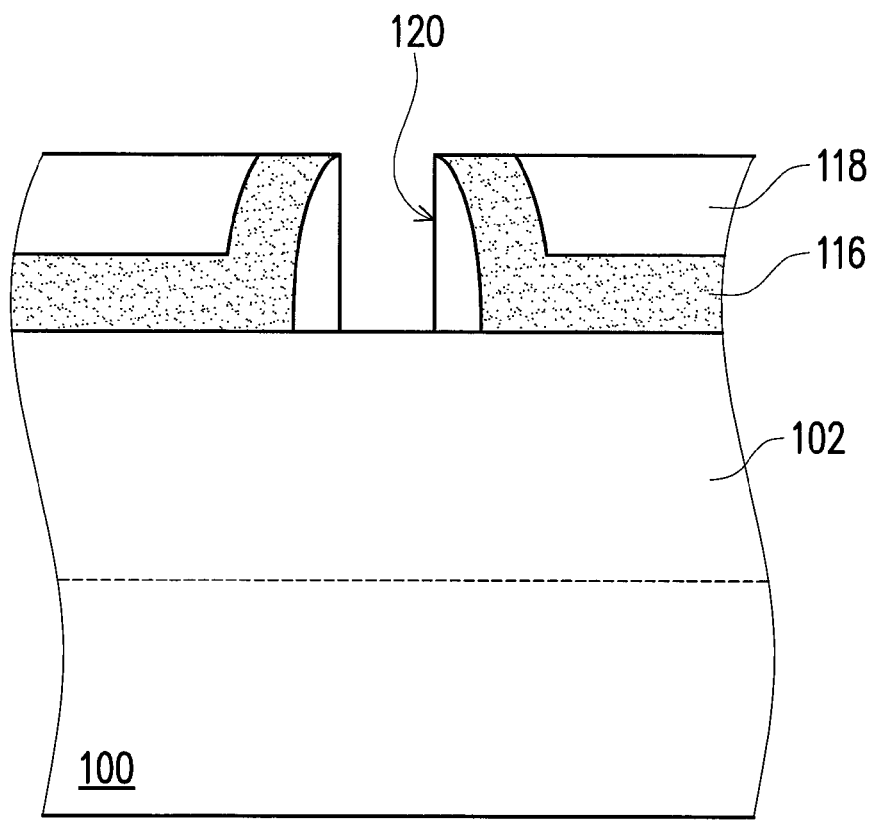

Referring to FIGS. 1E and 2E, the stacked structure 112 is removed to form a trench 120 in the ILD layer 118. The removing step includes performing a chemical mechanical polishing (CMP) process or an etching back process. Note that the first interfacial layer 106a can be regarded as a sacrificial layer since it is removed during the step of removing the stacked structure 112.

Figure 1F:
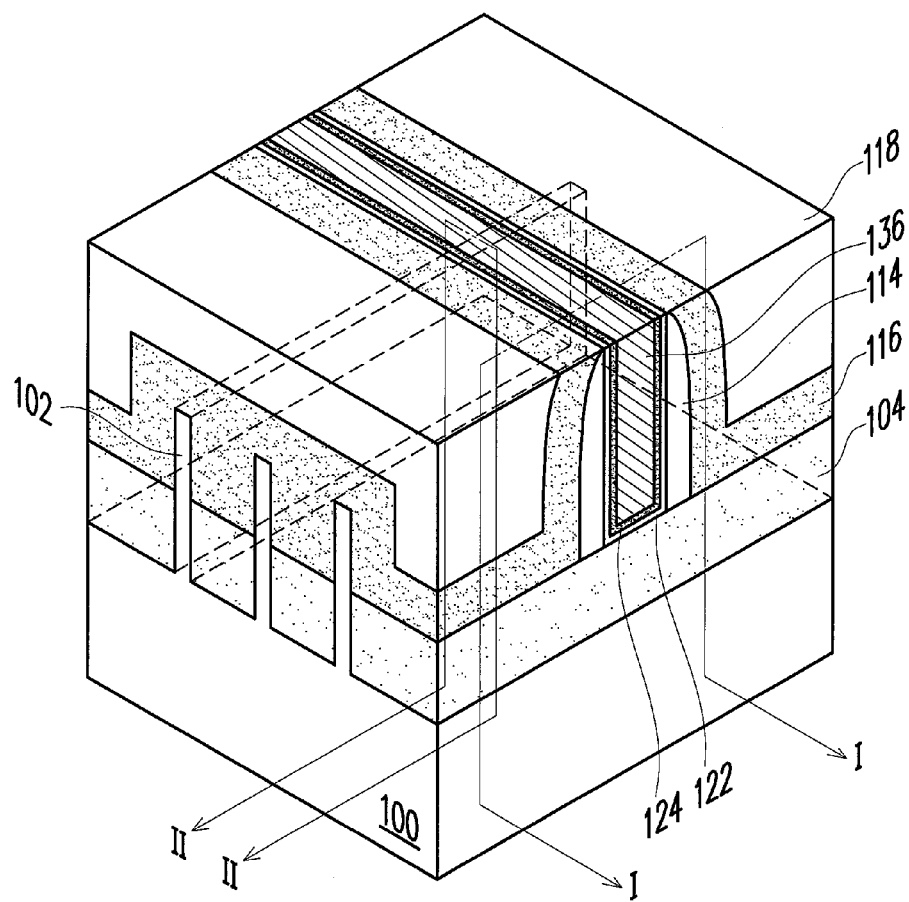
Figure 2F:
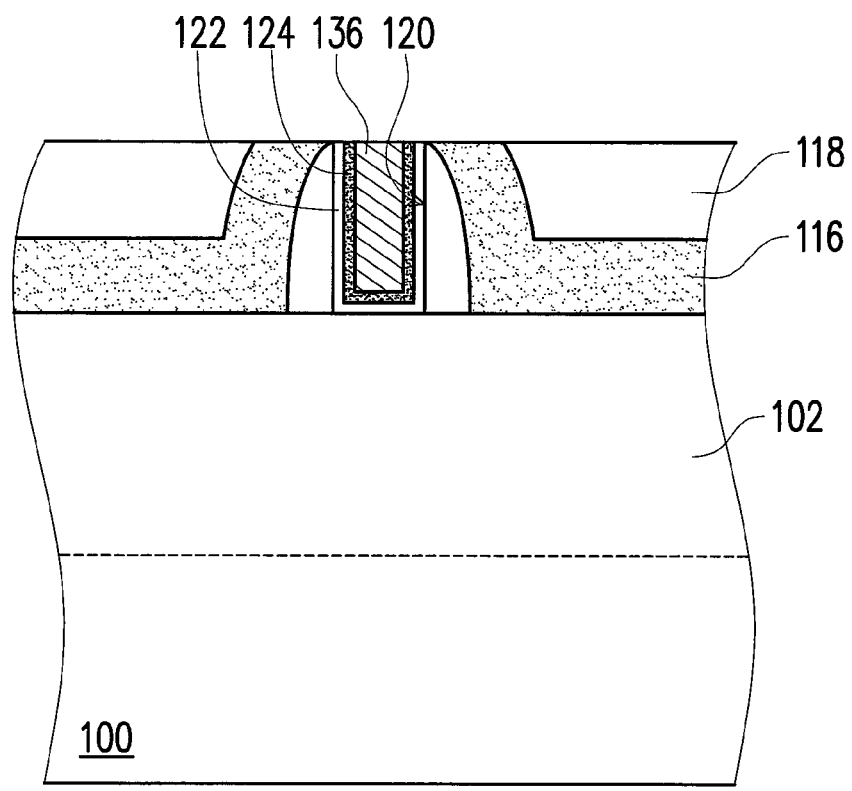
Figure 3:
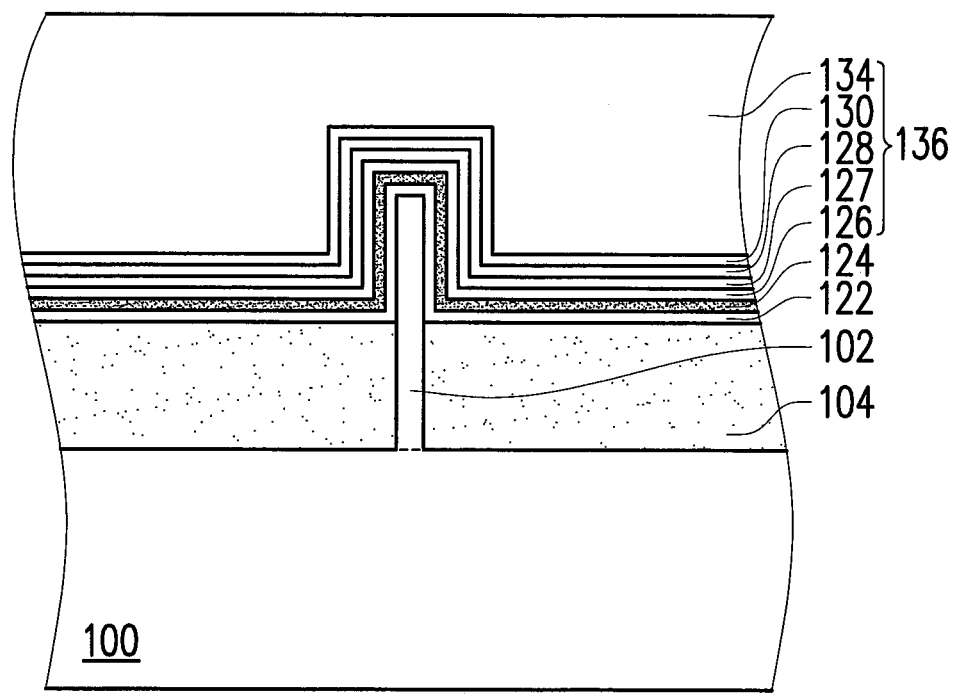
FIG. 3 is a schematic cross-sectional view taken along the line II-II of FIG. 1F.

Referring to FIGS. 1F and 2F, a second interfacial layer 122 and a first high-k layer 124 are sequentially formed at least on the surface of the trench 120. The second interfacial layer 122 includes silicon oxide, silicon nitride or silicon oxynitride. The second interfacial layer 122 is formed by a deposition process, such as an ALD process, a CVD process, a PVD process or a sputter deposition process. It is noted that the second interfacial layer 122 is formed by a deposition process rather than a thermal oxidation treatment. Silicon consumption due to the thermal oxidation treatment does not occur, so that the shape of the fins 102 is not deformed during the step of forming the second interfacial layer 122. FIG. 3 is a schematic cross-sectional view taken along the line II-II of FIG. 1F. As shown in FIG. 3, the second interfacial layer 122 is conformally formed along the surface of each fin 102. In the present embodiment, since the second interfacial layer 122 is formed by a deposition process without consuming any silicon, the shape of the fins 102 keeps well-defined after the formation of the second interfacial layer 122.

The first high-k layer 124 includes a high-k material with a dielectric constant greater than 4. The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide (SrTiO$_3$), zirconium silicon oxide (ZrSiO$_4$), hafnium zirconium oxide (HfZrO$_4$), strontium bismuth tantalate, (SrBi$_2$Ta$_2$O$_9$, SBT), lead zirconate titanate (PbZr$_x$Ti$_{1-x}$O$_3$, PZT), and barium strontium titanate (Ba$_x$Sr$_{1-x}$TiO$_3$, BST), wherein x is between 0 and 1. The first high-k layer 124 is formed by a deposition process, such as an ALD process, a CVD process, a PVD process or a sputter deposition process.

In an embodiment, at least one second high-k layer is formed after forming the second interfacial layer 122 and before forming the first high-k layer 124. The second high-k layer is different from the first high-k layer 124. The second high-k layer can have a dielectric constant less than or greater than that of the first high-k layer 124. The second high-k layer includes a high-k material with a dielectric constant greater than 4. The high-k material can be metal oxide, such as rare earth metal oxide. The high-k material can be selected from the group consisting of hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate, (SrBi$_2$Ta$_2$O$_9$, SBT), lead zirconate titanate (PbZr$_x$Ti$_{1-x}$O$_3$, PZT), and barium strontium titanate (Ba$_x$Sr$_{1-x}$TiO$_3$, BST), wherein x is between 0 and 1. The second high-k layer is formed by a deposition process, such as an ALD process, a CVD process, a PVD process or a sputter deposition process.

Thereafter, a composite metal layer 136 is formed on the substrate 100 to at least fill up the trench 120. As shown in FIG. 3, the composite metal layer 136 includes, from bottom to top, an optional bottom barrier layer 126, optional etch stop metal layer 127, a work function metal layer 128, an optional top barrier layer 130, and a low resistivity metal layer 134. The bottom barrier layer 126 includes TiN. The etch stop metal layer 127 includes TaN. The work function metal layer 128 includes TiAl (for forming an N-type device) or TiN (for forming a P-type device). The top barrier layer 130 includes TiN. The low resistivity metal material layer 134 includes Al or Cu. Each layer of the composite metal layer 136 can be formed by a deposition process, such as an ALD process, a CVD process, a PVD process or a sputter deposition process.

Afterwards, the second interfacial layer 122, the first high-k layer 124 and the composite metal layer 136 outside the trench 120 are removed. The FinFET device of the present invention is thus obtained, wherein the second interfacial layer 122 and the first high-k layer 124 serve as a gate dielectric layer, and the composite layer 136 serves as a metal gate.

In view of the above, both the first interfacial layer 106a as a sacrificial layer and the second interfacial layer 122 as a gate dielectric layer are not formed by a thermal oxidation treatment. Accordingly, the fin deformation caused by silicon consumption is not observed, and the effective channel of the FinFET is not affected.

The said embodiments in which the described method is applied to form a FinFET device is provided for illustration purposes, and is not construed as limiting the present invention. It is appreciated by persons skilled in the art that the described method can be applied to form a planar device including a metal gate or a polysilicon gate as long as the interfacial layer is formed by a deposition process without consuming any silicon from the substrate.

Figure 4A:
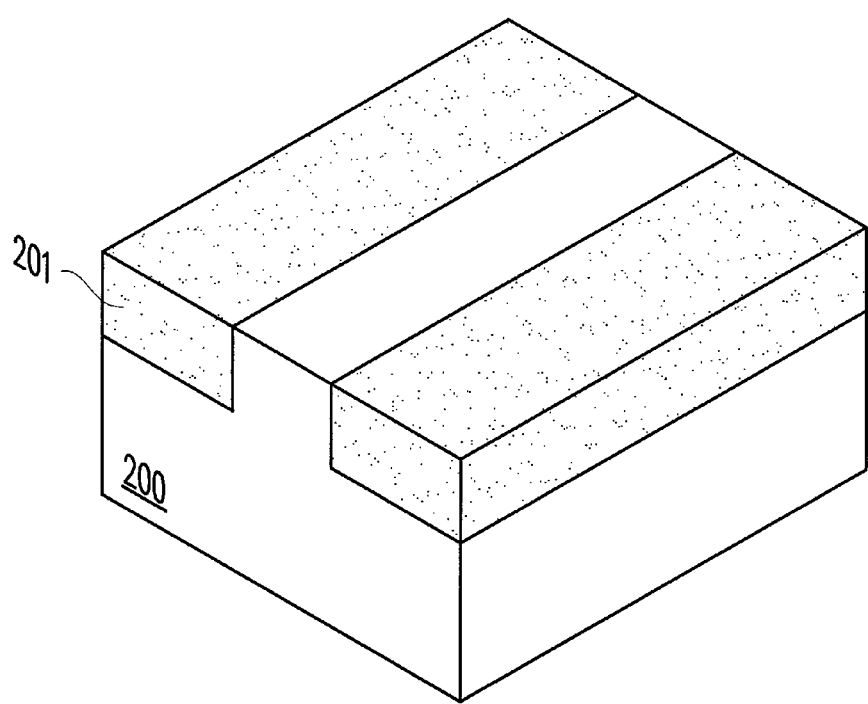
FIGS. 4A to 4B are three-dimensional schematic views illustrating a method of forming a semiconductor structure according to another embodiment of the present invention.
Figure 4B:
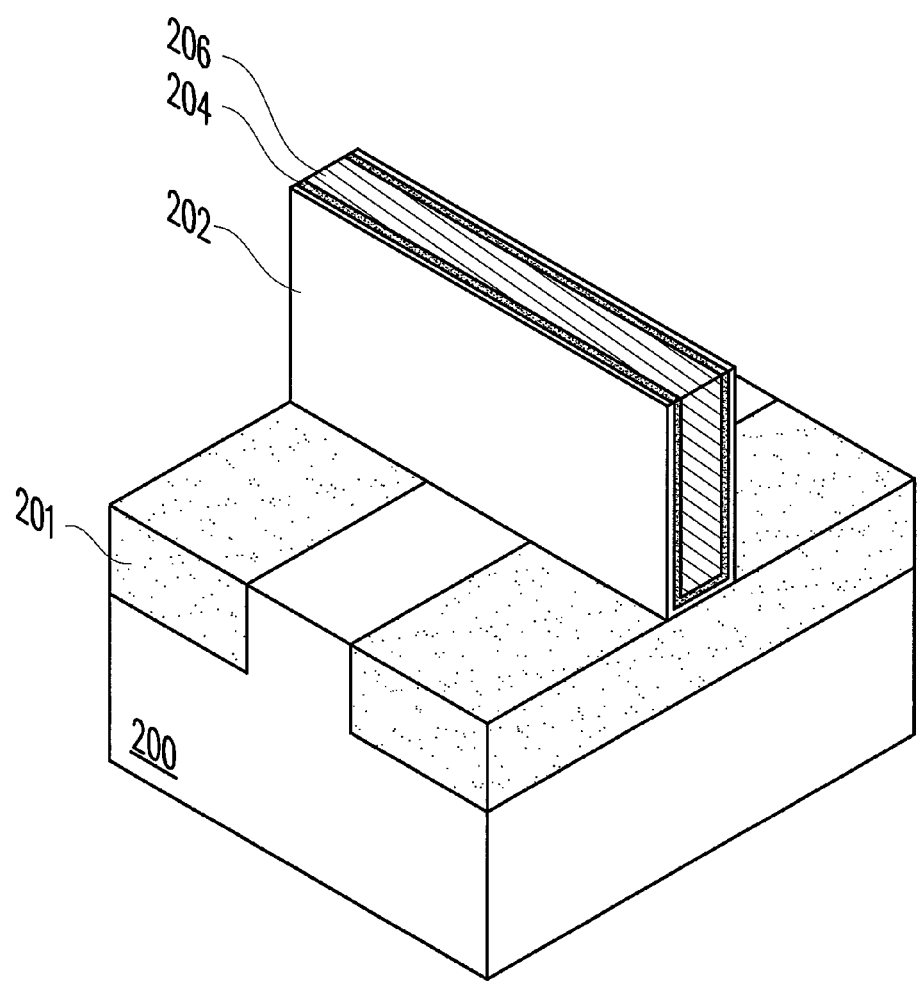

FIGS. 4A to 4B are three-dimensional schematic views illustrating a method of forming a semiconductor structure according to another embodiment of the present invention.

Referring to FIG. 4A, a semiconductor substrate is provided. The semiconductor substrate can be a bulk silicon-containing substrate 200 having shallow trench isolation (STI) structures 201 formed therein. Thereafter, the process steps similar to those as described in FIGS. 2B to 2F are implemented, so as to obtain a planar device including a metal gate (as shown in FIG. 4B). It is noted that only a substrate 200, STI structures 201, an interfacial layer 202, a high-k layer 204 and a metal gate 206 are shown in FIG. 4B for clarity and convenience of illustration.

Figure 5:
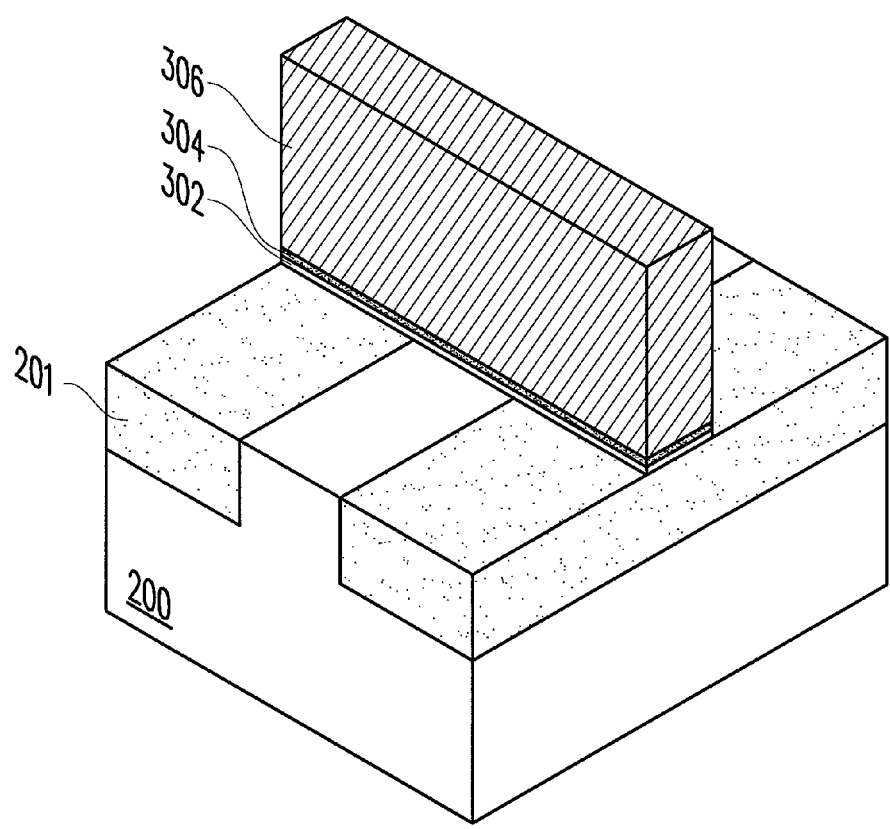
FIG. 5 is a three-dimensional schematic view illustrating a semiconductor structure according to yet another embodiment of the present invention.

In another embodiment, a semiconductor substrate as shown in FIG. 4A is provided, and the process steps similar to those as described in FIGS. 2B to 2C are performed thereto, wherein an additional high-k layer is formed between the interfacial layer and the mask layer. Thereafter, the following process steps including removing the mask layer, forming a spacer, forming source/drain regions etc. are known to persons skilled in the art, and the details are not iterated herein. The planar device including a polysilicon gate is thus obtained, as shown in FIG. 5. It is noted that only a substrate 200, STI structures 201, an interfacial layer 302, a high-k layer 304 and a polysilicon gate 306 are shown in FIG. 5 for clarity and convenience of illustration.

In summary, in the present invention, a deposition process is used to replace the conventional thermal oxidation treatment for forming an interfacial layer. In other words, the interfacial layer of the present invention can be formed without consuming any silicon from the fins (or substrate). In the said embodiments, device degradation caused by the fin deformation is not observed as the fins (or substrate) are not subjected to any silicon loss during the formation of the interfacial layer.

More specifically, the effective channel of the FinFET is disposed not only on the top surface portion but also on the sidewall portion of each fin. When the interfacial layer is formed by the conventional thermal oxidation treatment, the channel width of the FinFET is seriously loss due to the fin deformation from silicon consumption. The method of the present invention can resolve the said problem and keep the fin profile as well-defined as original. Thus, better channel control of the FinFET can be easily achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
   forming a first interfacial material layer by a deposition process on a substrate;
   forming a dummy gate material layer on the first interfacial material layer;
   patterning the dummy gate material layer and the first interfacial material layer to form a stacked structure;
   forming an interlayer dielectric (ILD) layer to cover the stacked structure;
   removing a portion of the ILD layer to expose a top of the stacked structure;
   removing the stacked structure to form a trench in the ILD layer;
   conformally forming a second interfacial layer and a first high-k layer at least on a surface of the trench; and
   forming a composite metal layer to at least fill up the trench, wherein the substrate is a substrate with fins extending in a first direction, and the stacked structure crosses the fins and extends in a second direction different from the first direction, wherein the composite metal layer comprises a work function metal layer and a low resistivity metal layer, and further comprises:

a bottom barrier layer, disposed between the first high-k layer and the work function metal layer;

a top barrier layer, disposed between the work function metal layer and the low resistivity metal layer; and an etch stop metal layer, disposed between the bottom barrier layer and the work function metal layer.

2. The method of claim 1, wherein the deposition process comprises an atomic layer deposition (ALD) process, a chemical vapor deposition (CVD) process, a physical vapor deposition (PVD) process or a sputter deposition process.

3. The method of claim 1, wherein the first interfacial material layer comprises silicon oxide, silicon nitride or silicon oxynitride.

4. The method of claim 1, wherein the second interfacial layer is formed by a deposition process.

5. The method of claim 4, wherein the deposition process comprises an ALD process, a CVD process, a PVD process or a sputter deposition process.

6. The method of claim 1, wherein the second interfacial layer comprises silicon oxide, silicon nitride or silicon oxynitride.

7. The method of claim 1, wherein the first high-k layer is formed by a deposition process.

8. The method of claim 1, wherein the first high-k layer comprises a high-k material with a dielectric constant greater than 4.

9. The method of claim 1, further comprising forming at least one second high-k layer after forming the second interfacial layer and before forming the first high-k layer.

10. The method of claim 9, wherein the second high-k layer is formed by a deposition process.

11. The method of claim 9, wherein the second high-k layer comprises a high-k material with a dielectric constant greater than 4.

12. The method of claim 1, wherein the second direction is perpendicular to the first direction.

13. The method of claim 1, further comprising forming an insulating layer to fill lower portions of gaps between the fins before forming the first interfacial material layer.

14. The method of claim 1, further comprising, after forming the stacked structure and before forming the ILD layer, forming a spacer beside the stacked structure; and forming a contact etch stop layer to cover the stacked structure.

15. The method of claim 1, further comprising removing the second interfacial layer, the first high-k layer and the composite metal layer outside the trench.

16. The method of claim 1, wherein the work function metal layer comprises TiAl or TiN, and the low resistivity metal layer comprises Al or Cu.

17. The method of claim 1, wherein the bottom barrier layer comprises TiN, the top barrier layer comprises TiN, and the etch stop metal layer comprises TaN.

* * * * *